United States Patent
Chen et al.

(10) Patent No.: US 9,478,521 B2
(45) Date of Patent: Oct. 25, 2016

(54) PACKAGE-ON-PACKAGE STRUCTURE

(71) Applicant: Taiwan Semiconductor Manufacturing Company, Ltd., Hsin-Chu (TW)

(72) Inventors: Hsien-Wei Chen, Hsin-Chu (TW); An-Jhih Su, Bade (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/496,948

(22) Filed: Sep. 25, 2014

(65) Prior Publication Data

US 2016/0093590 A1   Mar. 31, 2016

(51) Int. Cl.
  *H01L 23/495*   (2006.01)
  *H01L 25/065*   (2006.01)
  *H01L 25/00*    (2006.01)

(52) U.S. Cl.
  CPC ......... *H01L 25/0657* (2013.01); *H01L 25/50* (2013.01); *H01L 2224/18* (2013.01); *H01L 2224/32145* (2013.01); *H01L 2224/48091* (2013.01); *H01L 2224/48227* (2013.01); *H01L 2224/73265* (2013.01); *H01L 2225/06513* (2013.01); *H01L 2225/06548* (2013.01); *H01L 2924/15311* (2013.01); *H01L 2924/181* (2013.01)

(58) Field of Classification Search
  CPC ... H01L 23/495; H01L 25/065; H01L 23/00; H01L 23/31; H01L 23/522
  USPC .......................................... 257/667; 438/653
  See application file for complete search history.

(56) References Cited

U.S. PATENT DOCUMENTS

| | | | |
|---|---|---|---|
| 6,214,716 B1 * | 4/2001 | Akram ................. | G01R 1/0483 438/612 |
| 2007/0187836 A1 * | 8/2007 | Lyne ................... | H01L 25/0657 257/777 |
| 2010/0019382 A1 * | 1/2010 | Miwa ................... | H01L 25/105 257/737 |
| 2013/0161836 A1 * | 6/2013 | Yeom ................... | H01L 21/563 257/778 |
| 2015/0235991 A1 * | 8/2015 | Gu ...................... | H01L 25/0655 257/762 |
| 2016/0020190 A1 * | 1/2016 | Wu ....................... | H01L 24/97 438/113 |

* cited by examiner

Primary Examiner — Phuc Dang
(74) Attorney, Agent, or Firm — Slater Matsil, LLP

(57) ABSTRACT

A device comprises a top package mounted on a bottom package through a joint structure, wherein the joint structure comprises a solder ball of the top package coupled to a metal structure embedded in the bottom package and an epoxy protection layer having a first edge in direct contact with a top surface of the bottom package and a second edge surrounding a lower portion of the solder ball.

20 Claims, 8 Drawing Sheets

PACKAGE-ON-PACKAGE STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package-on-package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package-on-package semiconductor devices. Furthermore, package-on-package semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
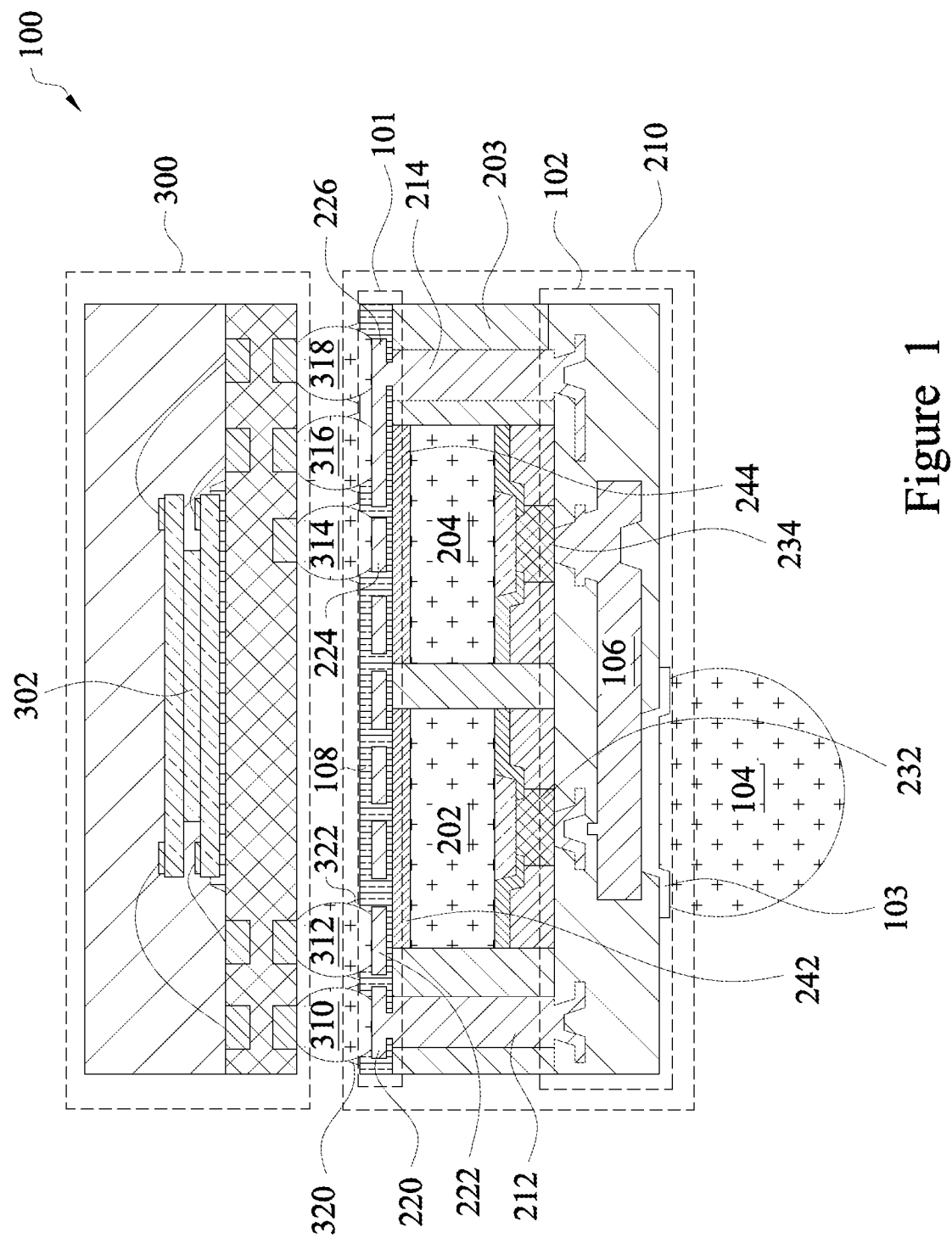
FIG. 1 illustrates a cross sectional view of a package-on-package semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a package-on-package semiconductor device in accordance with various embodiments of the present disclosure. The package-on-package semiconductor device 100 may include a bottom package 210 and a top package 300. In particular, the top package 300 is stacked on top of the bottom package 210. As shown in FIG. 1, the top package 300 and the bottom package 210 are bonded together through a joint structure formed by conductive bumps 310, 312, 314, 316 and 318. In some embodiments, the conductive bumps 310, 312, 314, 316 and 318 are solder balls. The joint structure may be generated by a reflow process. Throughout the description, the conductive bumps (e.g., conductive bump 310) are alternatively referred to as the solder balls (e.g., solder ball 310).

The bottom package 210 includes front-side interconnect structures 102, backside interconnect structures 101, a first semiconductor die 202 and a second semiconductor die 204. As shown in FIG. 1, the first semiconductor die 202 and the second semiconductor die 204 are embedded in a molding compound layer 203. The first sides of the first semiconductor die 202 and the second semiconductor die 204 are coupled to the backside interconnect structures 101 through die attach films (DAF) 242 and 244 respectively. The second sides of the first semiconductor die 202 and the second semiconductor die 204 are coupled to the front-side interconnect structures 102 through vias 232 and 234 respectively. In some embodiments, vias 232 and 234 are copper vias.

It should be noted that while FIG. 1 illustrates only two semiconductor dies (e.g., semiconductor dies 202 and 204) in the bottom package 210, the bottom package 210 may include hundreds of such semiconductor dies. The number of semiconductor dies illustrated herein is limited solely for the purpose of clearly illustrating the inventive aspects of the various embodiments. The present disclosure is not limited to any specific number of semiconductor dies.

It should further be noted that while FIG. 1 illustrates the bottom package 210 is formed by the front-side interconnect structures 102, the backside interconnect structures 101 and the molding compound layer 203, the structure of the package-on-package semiconductor device 100 shown in FIG. 1 is merely an example. One of ordinary skill in the art would recognize many variations, alternatives, and modifications. For example, the bottom package 210 may be a silicon substrate. Alternatively, the bottom package 210 may be other suitable structures such as a glass interposer.

In some embodiments, the bottom package 210 is a silicon substrate. The substrate may be formed of silicon, although it may also be formed of other group III, group IV, and/or group V elements, such as silicon, germanium, gallium, arsenic, and combinations thereof and/or the like.

According to alternative embodiments, the bottom package 210 may be made of other suitable materials such as ceramic materials, organic materials, any combinations thereof and/or the like.

The interconnect structures (e.g., front-side interconnect structures 102 and backside interconnect structures 101) may include an inter-layer dielectric (ILD) layer, an inter-metal dielectric (IMD) layer, a metal line and a redistribution line. This interconnect structures shown in FIG. 1 are merely an example, which should not unduly limit the scope of the claims. One of ordinary skill in the art would recognize many variations, alternatives, and modifications. For example, the interconnect structure may comprise a plurality of IMD layers.

It should be noted the interconnect structure may comprise a plurality of metal lines and/or redistribution lines. For simplicity, only one redistribution line 106 is shown in the front-side interconnect structures 102. Likewise, redistribution lines 220, 222, 224 and 226 are shown in the backside interconnect structures 101.

As shown in FIG. 1, the redistribution line 106 is formed in the front-side interconnect structures 102 of the bottom package 210. More particularly, the redistribution line 106 provides a conductive path between semiconductor dies (e.g., semiconductor die 204) and the bumps (e.g., bump 104) formed over the front-side of the bottom package 210.

The redistribution line 106 may be formed of suitable metal materials such as aluminum, aluminum alloys, copper or copper alloys and/or the like. The redistribution line 106 may be formed by a damascene process, although other suitable techniques such as deposition may alternatively be used. The damascene process is well known in the art, and hence is not discussed herein.

The redistribution lines 220, 222, 224 and 226 may be formed in the backside interconnect structures 101 of the bottom package 210. More particularly, the redistribution lines 220, 222, 224 and 226 are embedded in a dielectric layer 108 as shown in FIG. 1. The material and the formation method of the redistribution lines 220, 222, 224 and 226 may be similar to that of the redistribution line 106 described above. Therefore, explicit description of the formation of the redistribution lines 220, 222, 224 and 226 is omitted to avoid unnecessary repetition.

One skilled in the art will recognize that the interconnect structure may comprise more inter-metal dielectric layers and the associated metal lines and plugs. In particular, the layers between the metallization layers may be formed by alternating layers of dielectric (e.g., extremely low-k dielectric material) and conductive materials (e.g., copper).

It should be noted that the redistribution lines (e.g., redistribution line 106) may be a single material layer, or a multi-layered structure and may be made of metals such as titanium, titanium nitride, aluminum, tantalum, copper and combinations thereof.

The bottom package 210 may further comprise a plurality of through vias 212 and 214. In some embodiments, the through vias 212 and 214 may be filled with a conductive material such as copper, tungsten and/or the like. The front-side interconnect structures 102 of bottom package 210 may be coupled to the backside interconnect structures 101 through the plurality of 212 and 214.

As shown in FIG. 1, the backside interconnect structures 101 comprise the dielectric layer 108. More particularly, the dielectric layer 108 is formed over the molding compound layer 203. As shown in FIG. 1, the redistribution lines 220, 222, 224 and 226 are embedded in the dielectric layer 108. The lower portions of the joint structure formed by conductive bumps 310-318 are surrounded by the dielectric layer 108.

In some embodiments, the dielectric layer 108 is formed of polybenzoxazole (PBO). In alternative embodiments, the dielectric layer 108 is formed of a photo-sensitive material such as, polyimide, benzocyclobutene (BCB), any combinations thereof and/or the like, which may be easily patterned using a lithography mask. In alternative embodiments, the dielectric layer 108 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like.

The dielectric layer 108 may be formed by suitable fabrication techniques such as such as spinning, chemical vapor deposition (CVD), and plasma enhanced CVD (PECVD) and/or the like.

FIG. 1 further illustrates a bump 104 is formed on the front-side of the bottom package 210. In some embodiments, the bump 104 is a solder ball. In some embodiments, the solder ball 104 may comprise SAC405. SAC405 comprises 95.5% Sn, 4.0% Ag and 0.5% Cu. In alternative embodiments, the bump 104 may be a land grid array (LGA) pad.

As shown in FIG. 1, there may be an under bump metallization (UBM) structure 103 formed underneath the bump 104. The UBM structure 103 is formed over the redistribution line 106 as shown in FIG. 1. The UBM structure 103 helps to prevent diffusion between the solder ball 104 and the integrated circuits of the bottom package 210, while providing a low resistance electrical connection.

The semiconductor dies 202 and 204 are embedded in the molding compound layer 203 and between the front-side interconnect structures 102 and the backside interconnect structures 101. In some embodiments, the semiconductor dies 202 and 204 may be picked and placed on top of the bottom package 210. After a reflow process, the semiconductor dies 202 and 204 are bonded on the bottom package 210 through the vias 232 and 234, which are coupled between the bottom package 210 and the semiconductor dies (e.g., semiconductor die 202).

In order to give a basic insight of the inventive aspects of various embodiments, the semiconductor dies 202 and 204 are drawn without details. However, it should be noted that the semiconductor dies 202 and 204 may comprise basic semiconductor layers such as active circuit layers, substrate layers, ILD layers and IMD layers (not shown respectively).

The semiconductor dies 202 and 204 may comprise a substrate. The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a variety of applications such as logic circuits.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

The top package 300 may comprise a plurality of stacked dies 302, which may be wire-bonded to the input and output terminals of the top package 300. The stacked dies 302 of the top package 300 may comprise memory dies, logic dies, processor dies and/or the like. It should be noted while FIG. 1 illustrates two stacked dies 302 in the top package 300, this is merely an example. Likewise, the use of wire bonding is merely illustrative and other approaches for electrically connecting the stacked dies 302 are within the contemplated scope of the present disclosure.

The top package 300 may be bonded on the bottom package 210 through a reflow process. The bonding process comprises placing the solder balls (e.g., solder ball 310) against the respective metal structures (e.g., redistribution line 220). A reflow process is then performed to melt solder balls, thereby electrically connecting the metal structures in the bottom package 210 to the solder balls of the top package 300.

As shown in FIG. 1, the joint structure includes a plurality of solder balls (e.g., solder balls 310-318). A lower portion of each solder ball is surrounded by a protection layer. For example, solder balls 310 and 312 are surrounded by protection layers 320 and 322 respectively. The detailed structure and formation process of the protection layers (e.g., protection layer 320) will be described below with respect to FIGS. 2-6.

Figure 2:
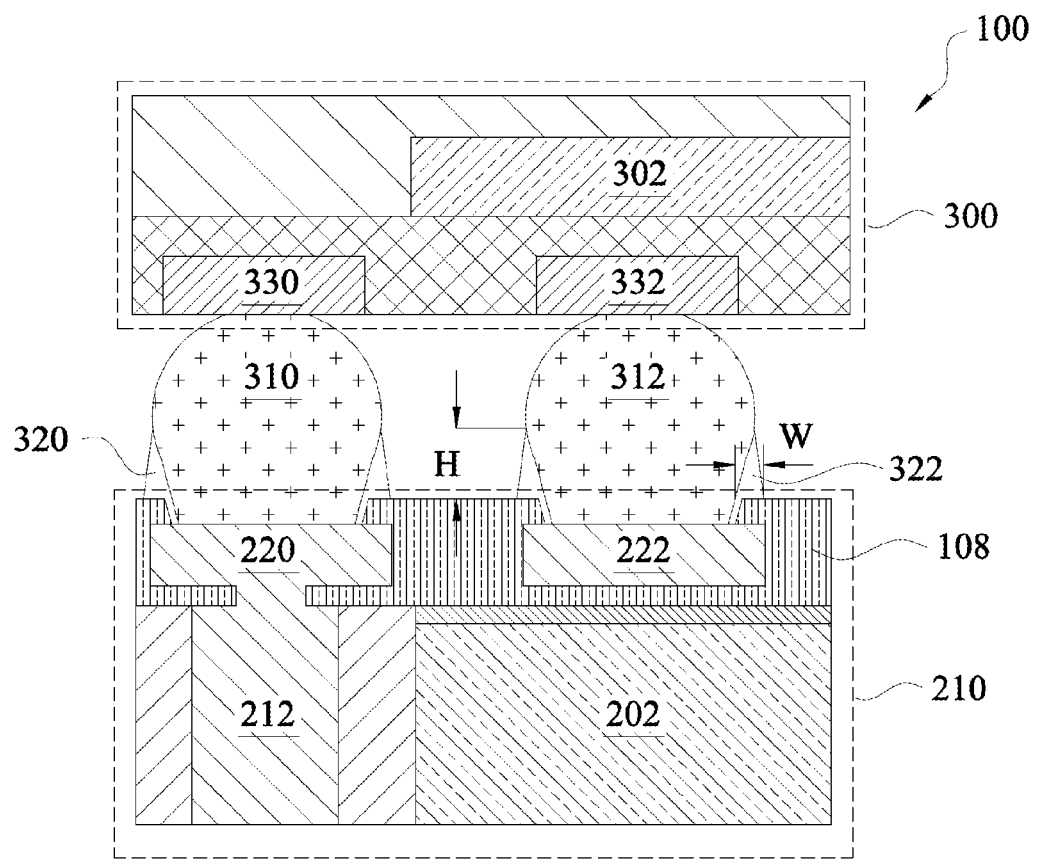
FIG. 2 illustrates in detail a cross sectional view of a portion of the joint structure of the package-on-package semiconductor device shown in FIG. 1 in accordance with various embodiments of the present disclosure.

FIG. 2 illustrates in detail a cross sectional view of a portion of the joint structure of the package-on-package semiconductor device shown in FIG. 1 in accordance with various embodiments of the present disclosure. The joint structure includes a first solder ball 310 and a second solder ball 312. The first solder ball 310 has a first terminal connected to a first pad 330 of the top package 300 and a second terminal connected to the redistribution line 220 of the bottom package 210. Likewise, the second solder ball 312 has a first terminal connected to a second pad 332 of the top package 300 and a second terminal connected to the redistribution line 222 of the bottom package 210.

A lower portion of the first solder ball 310 is surrounded by a first protection layer 320. More particularly, the gap between the first solder ball 310 and the dielectric layer 108 is filled by the first protection layer 320. As shown in FIG. 2, the first protection layer 320 includes two portions. A first portion is of a triangle shape from the cross sectional view. The first portion has a first edge in direct contact with the top surface of the dielectric layer 108 and a second edge surrounding the lower portion of the first solder ball 310. A second portion of the protection layer 320 fills the gap between the first solder ball 310 and the dielectric layer 108. The first protection layer 320 may function as a sealing structure preventing moisture from penetrating into the bottom package 210. As a result, the reliability of the joint structure is improved. The second protection layer 322 is similar to the first protection layer 320, and hence is not discussed herein to avoid repetition.

The first protection layer 320 and the second protection layer 322 may be formed of epoxy. The detailed process of forming the first protection layer 320 and the second protection layer 322 will be described below with respect to FIGS. 3-6.

In some embodiments, the width of first protection layer 320 and the second protection layer 322 is defined as W as shown in FIG. 2. The height of the first protection layer 320 and the second protection layer 322 is defined as H as shown in FIG. 2. In some embodiments, W is in a range from about 15 um to about 30 um. H is in a range from about 15 um to about 50 um.

An advantageous feature of having the protection layers (e.g., protection layer 320) surrounding the solder balls (e.g., solder ball 310) is that the first protection layer 320 and the second protection layer 322 help to prevent moisture from penetrating into the bottom package 210. More particularly, there is not enough adhesion between the solder balls (e.g., solder ball 310) and the dielectric layer 108. A gap may be formed between the outer edge of the solder ball and the sidewall of the trench in the dielectric layer 108. Such a gap may provide a moisture penetration path. The moisture may cause a variety of reliability issues such as PBO delamination and cracking during reliability tests.

The first protection layer 320 and the second protection layer 322 may function as sealing structures to prevent moisture from penetrating into the bottom package 210. As a result, the reliability problems described above can be reduced.

FIGS. 3-6 illustrate intermediate steps of fabricating the package-on-package semiconductor device shown in FIG. 2 in accordance with various embodiments of the present disclosure. It should be noted that the fabrication steps as well as the package-on-package structure shown in FIGS. 3-6 are merely an example. A person skilled in the art will recognize there may be many alternatives, variations and modifications.

Figure 3:
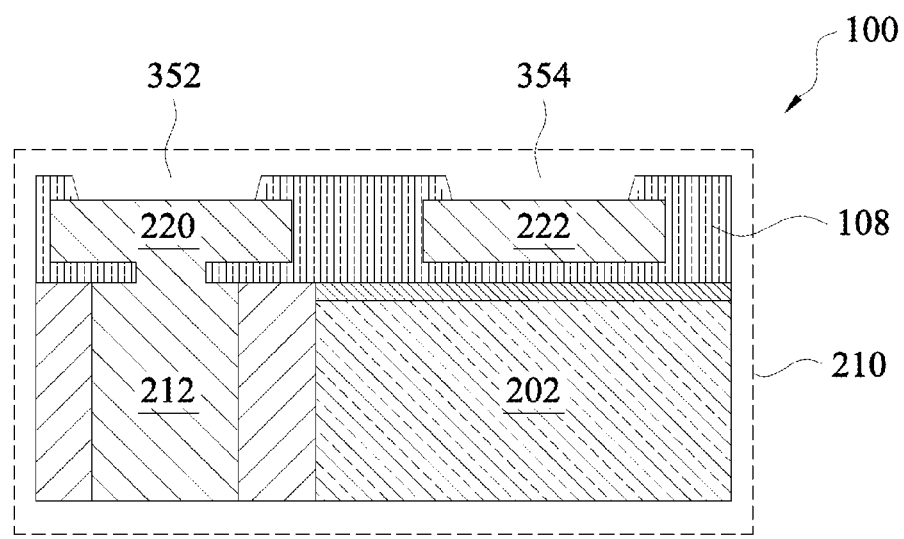
FIG. 3 illustrates a cross sectional view of forming a plurality of trenches in a dielectric layer in accordance with various embodiments of the present disclosure.

FIG. 3 illustrates a cross sectional view of forming a plurality of trenches in a dielectric layer in accordance with various embodiments of the present disclosure. According to the location of the redistribution lines 220 and 222, trenches 352 and 354 are formed by suitable fabrication processes such as an etching process, a laser ablation process, a mechanical machining process, a laser assisted etching process, any combinations thereof and/or the like.

In some embodiments, the trenches 602 and 604 are formed by a laser ablation process. The laser ablation process is applied to the dielectric layer 108 until the top surfaces of the redistribution lines 220 and 222 are exposed as shown in FIG. 3.

Figure 4:
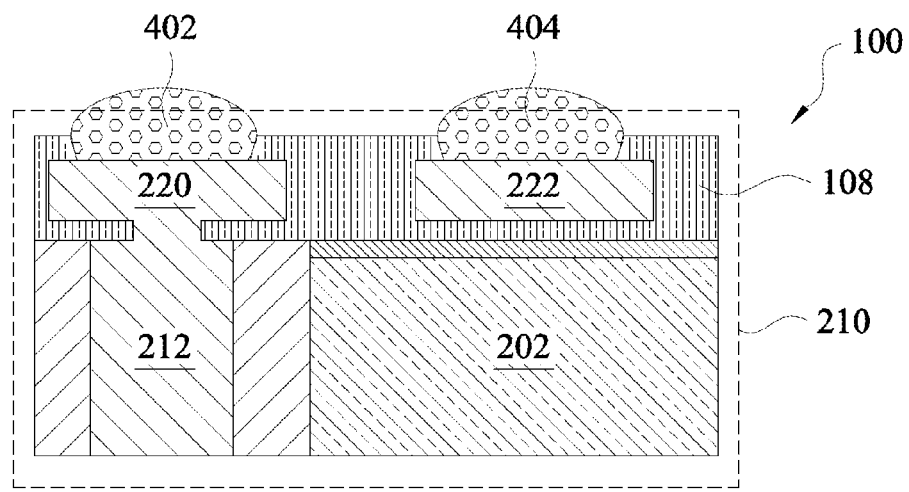
FIG. 4 illustrates a cross sectional view of the semiconductor device shown in FIG. 3 after an epoxy flux material is dispersed in the trenches in accordance with various embodiments of the present disclosure.

FIG. 4 illustrates a cross sectional view of the semiconductor device shown in FIG. 3 after an epoxy flux material is dispersed in the trenches in accordance with various embodiments of the present disclosure. In some embodiments, the epoxy flux material is a reflow curable epoxy flux material. The epoxy flux material includes both flux and epoxy. The epoxy portion may comprise polyepoxide and/or the like. The flux portion may comprises suitable flux materials such as zinc chloride, ammonium chloride, any combinations thereof and/or the like. During a reflow process, the flux portion enables a robust solder joint formation. The epoxy portion functions as an underfill material.

The epoxy flux material may be dispersed over the redistribution lines 220 and 222 through suitable fluid dispensing systems such as a needle dispenser, a jet dispenser and/or the like. After the dispensing process finishes, two epoxy flux layers 402 and 404 are formed over the redistribution lines 220 and 222 respectively. As shown in FIG. 4, the top surfaces of the epoxy flux layers 402 and 404 are higher than the top surface of the dielectric layer 108.

Figure 5:
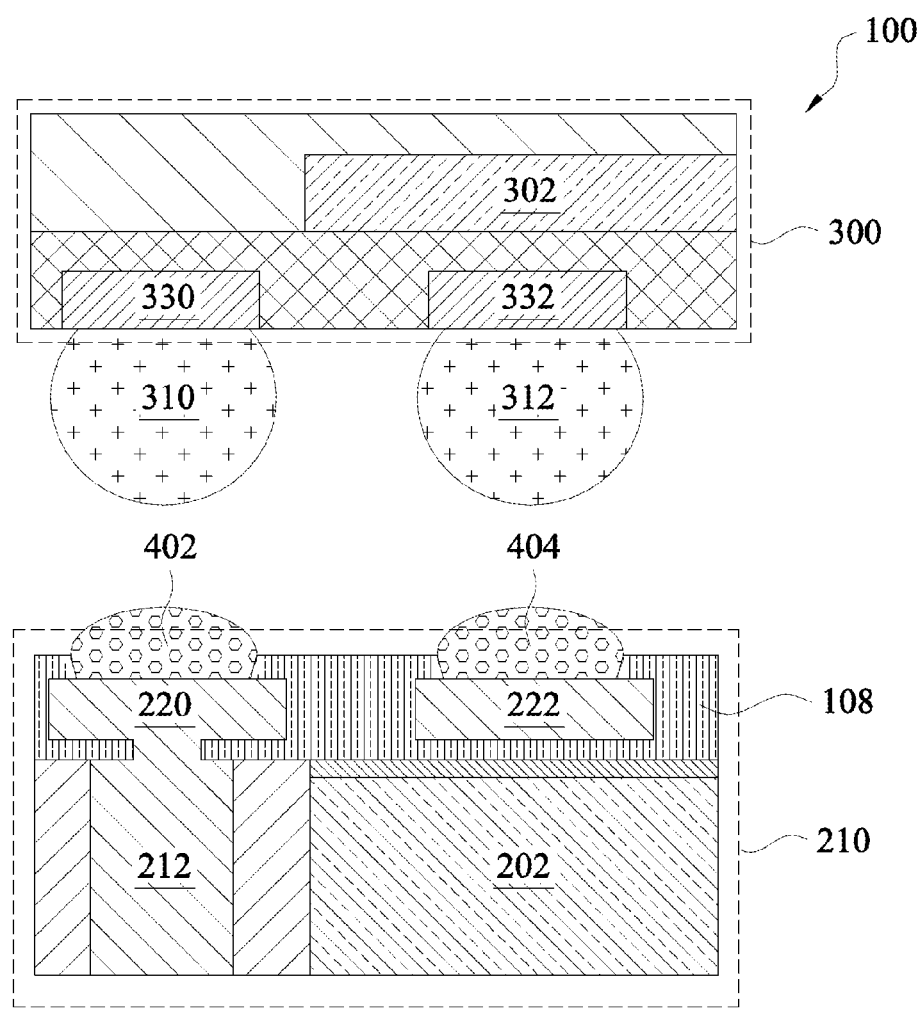
FIG. 5 illustrates a cross sectional view of a top package placed over the bottom package in accordance with various embodiments of the present disclosure.

FIG. 5 illustrates a cross sectional view of a top package placed over the bottom package in accordance with various embodiments of the present disclosure. The top package 300 may comprise a plurality of solder balls 310 and 312. The top package 300 is picked up using a vacuum pick-up tool (not shown) such as a vacuum needle and/or the like. The vacuum pick-up tool is arranged such that the solder balls 310 and 312 are directed towards their respective redistribution lines 220 and 222.

Figure 6:
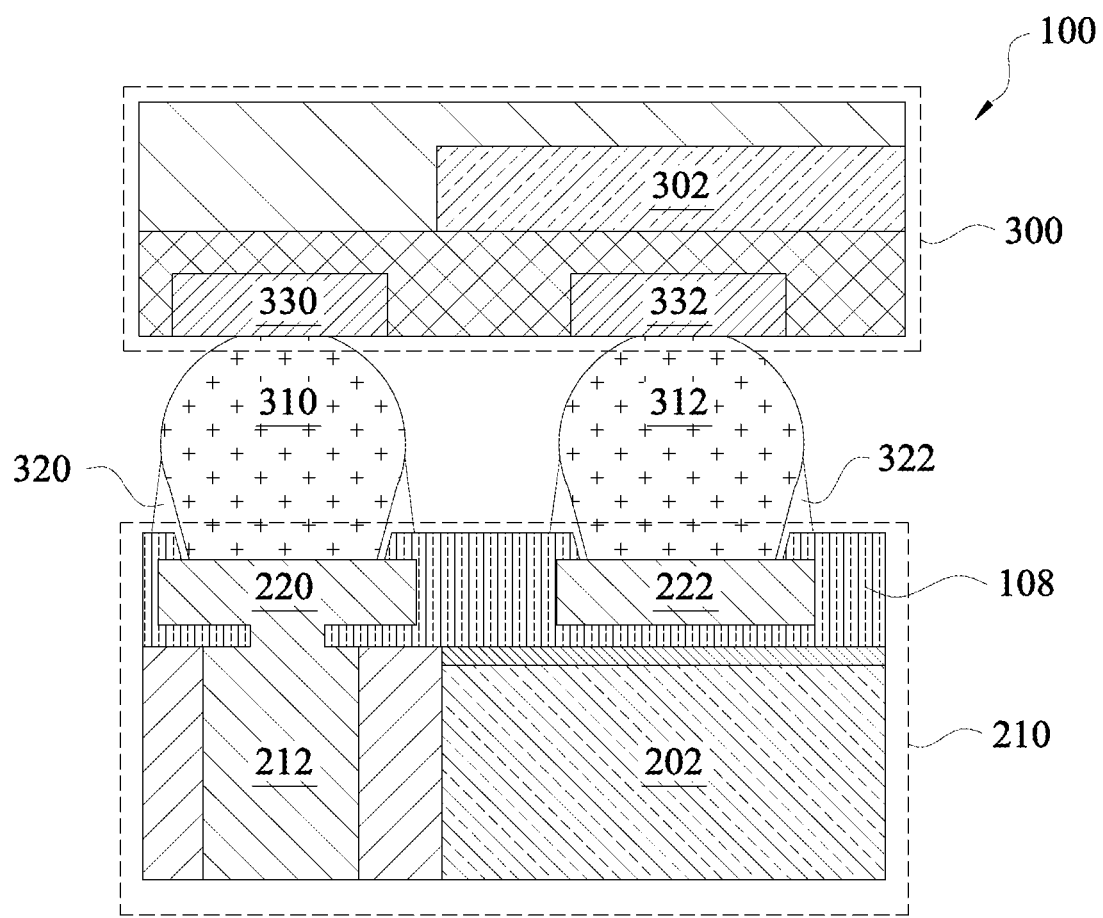
FIG. 6 illustrates a cross sectional view of the semiconductor device shown in FIG. 5 after the top package is mounted on the bottom package in accordance with various embodiments of the present disclosure.

FIG. 6 illustrates a cross sectional view of the semiconductor device shown in FIG. 5 after the top package is mounted on the bottom package in accordance with various embodiments of the present disclosure. The vacuum pick-up tool (not shown) may press the top package 300 against the bottom package 210 to force the bottom surfaces of the solder balls 310 and 312 in direct contact with the top surfaces of their respective redistribution lines 220 and 222. As the pressure from the top package 300 is applied, the contact interfaces of the solder balls 310 and 312 and their respective redistribution lines 220 and 222 are free of the epoxy flux material. In addition, the solder balls 310 and 312 may push a portion of the epoxy flux material away from the joint structure formed by the solder balls 310, 312 and the redistribution lines 220, 222. As a result, the epoxy flux material may surround the lower portions of the solder balls 310 and 312.

A reflow process is then performed to melt solder balls 310 and 312, thereby forming a joint structure between the top package 300 and the bottom package 210. The joint structure electrically connects the solder balls 310 and 312 to their respective redistribution lines 220 and 222. Meanwhile, the epoxy portion of the epoxy flux material encapsulates the lower portions of the solder balls 310 and 312, and fills the gap between the solder balls 310, 312 and the dielectric layer 108.

One advantageous feature of the fabrication steps shown in FIGS. 3-6 is the protection layers 320 and 322 are formed around their respective solder balls through a self-aligned process. The formation of the protection layers 320 and 322 does not require additional masks. Such a self-aligned process helps to reduce the cost of fabricating the semiconductor device shown in FIG. 2.

Figure 7:
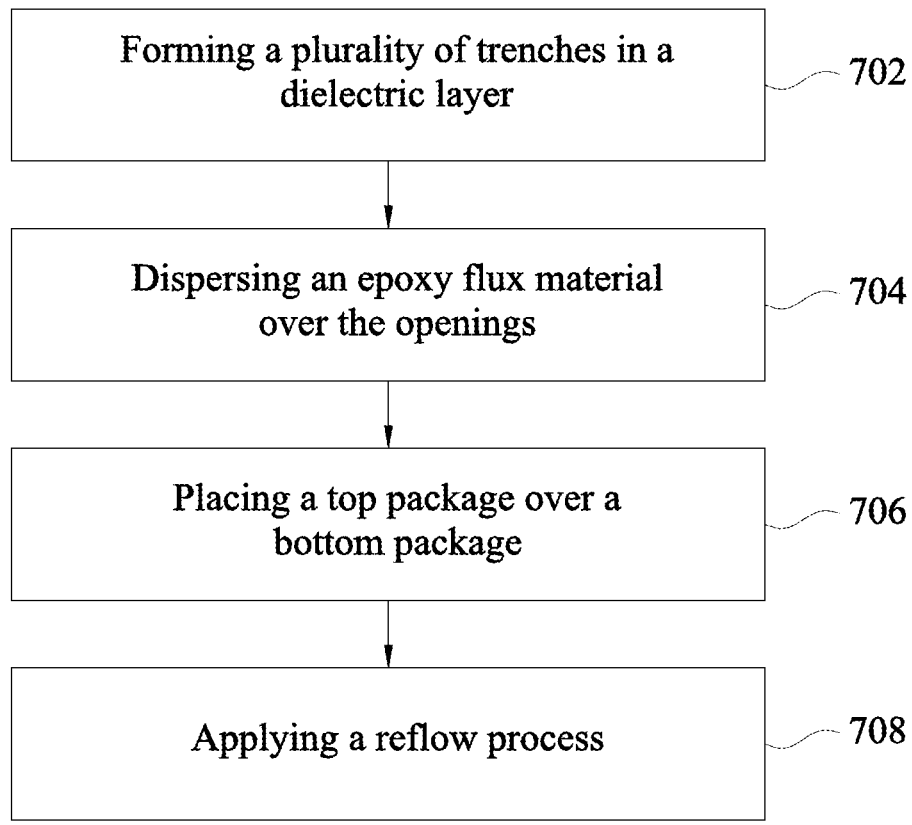
FIG. 7 illustrates a flow chart of a method for forming the semiconductor device shown in FIG. 2 in accordance with various embodiments of the present disclosure.

FIG. 7 illustrates a flow chart of a method for forming the semiconductor device shown in FIG. 2 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 7 may added, removed, replaced, rearranged and repeated.

At step 702, a plurality of trenches may be formed in a dielectric layer. The trenches are over their respective metal structures in a bottom package of a package-on-package semiconductor device. The metal structures are redistribution lines according to some embodiments.

At step 704, an epoxy flux material is dispersing in the trenches to form epoxy flux layers. The top surfaces of the epoxy flux layers are higher than the top surface of the dielectric layer.

At step 706, a top package is picked up by a vacuum tool. The top package includes a plurality of solder balls. The vacuum tool presses the solder balls of the top package against their respective metal structures of the bottom package, wherein the epoxy flux layers are pushed away from the trenches.

At step 708, a reflow process is applied to the solder balls so as to form a joint structure between the top package and the bottom package.

Figure 8:
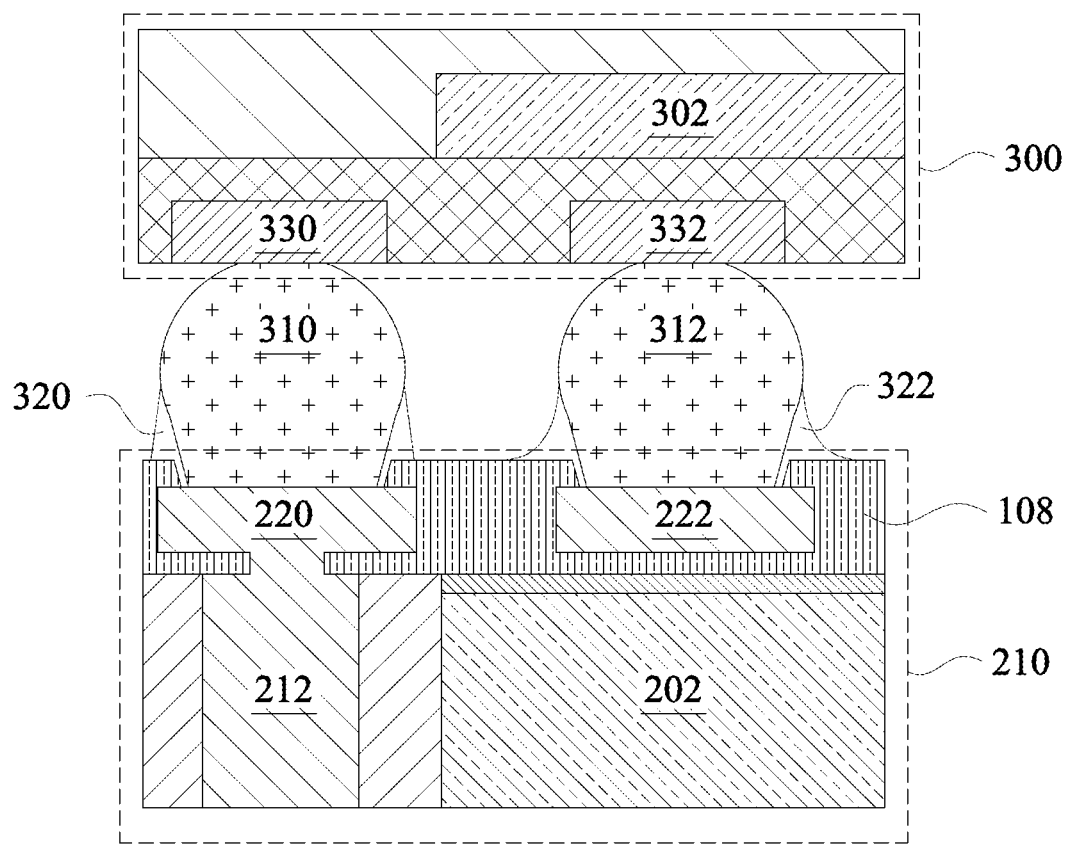
FIG. 8 illustrates a cross sectional view of another joint structure of the package-on-package semiconductor device shown in FIG. 1 in accordance with various embodiments of the present disclosure.

FIG. 8 illustrates a cross sectional view of another joint structure of the package-on-package semiconductor device shown in FIG. 1 in accordance with various embodiments of the present disclosure. The joint structure shown in FIG. 8 is similar to the joint structure shown in FIG. 2 except that the second protection layer 322 may be of a slightly different shape. As shown in FIG. 8, the second protection layer 322 is of a concave meniscus shape from the cross sectional view.

It should be noted that the protection layers (e.g., protection layer 320) are substantially triangular in shape from the cross sectional view. It is within the scope and spirit of various embodiments for the protection layers to comprise other shapes, such as, but no limited to oval, square and/or irregular shapes such as the concave meniscus shape.

Figure 9:
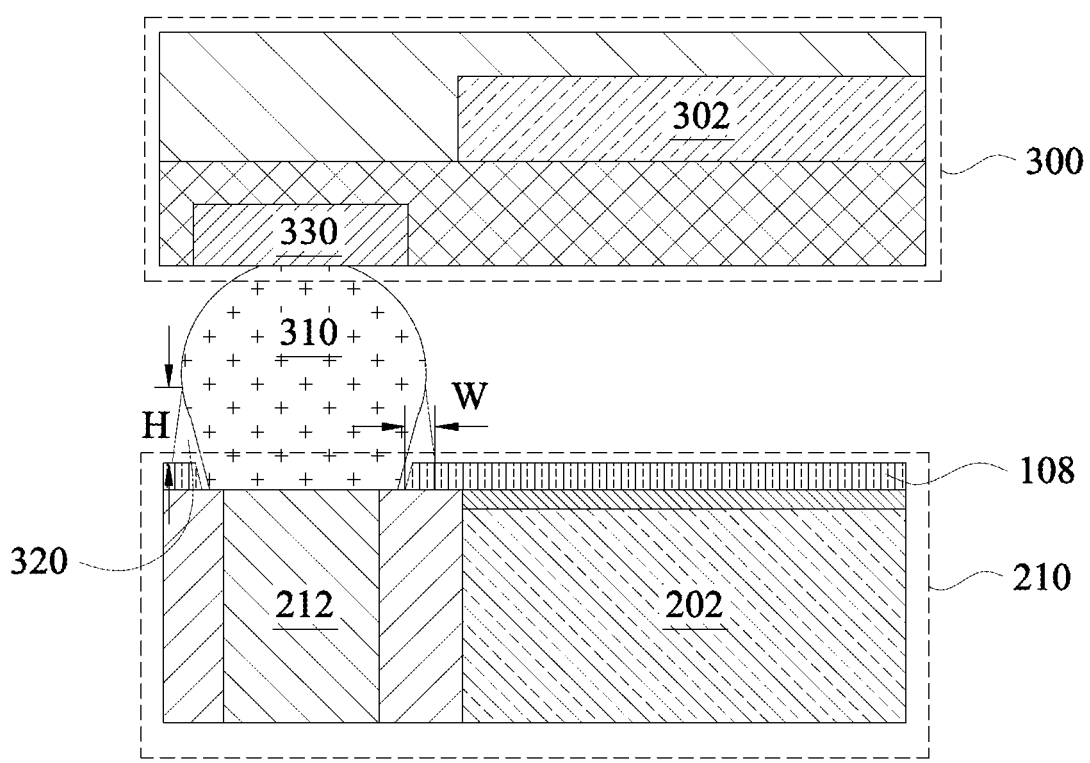
FIG. 9 illustrates a cross sectional view of another joint structure of the package-on-package semiconductor device shown in FIG. 1 in accordance with various embodiments of the present disclosure.

FIG. 9 illustrates a cross sectional view of another joint structure of the package-on-package semiconductor device shown in FIG. 1 in accordance with various embodiments of the present disclosure. The joint structure shown in FIG. 9 is similar to the joint structure shown in FIG. 2 except that the solder ball 310 is directly formed on the top surface of the through via 212.

As shown in FIG. 9, the width of the top surface of the through via 212 is greater than the width of the bottom of the trench. The first protection layer 320 includes two portions. A first portion surrounds the lower portion of the solder ball 310. A second portion fills the gap between the outer surface of the solder ball 310 and the sidewalls of the trench in the dielectric layer 108. As shown in FIG. 9, the bottom of the second portion the protection layer 320 is in direct contact with the top surface of the through via 212.

In some embodiments, the width of the protection layer 320 is defined as W as shown in FIG. 9. The height of the protection layer 320 is defined as H as shown in FIG. 9. In some embodiments, W is in a range from about 15 um to about 30 um. H is in a range from about 15 um to about 50 um.

Figure 10:
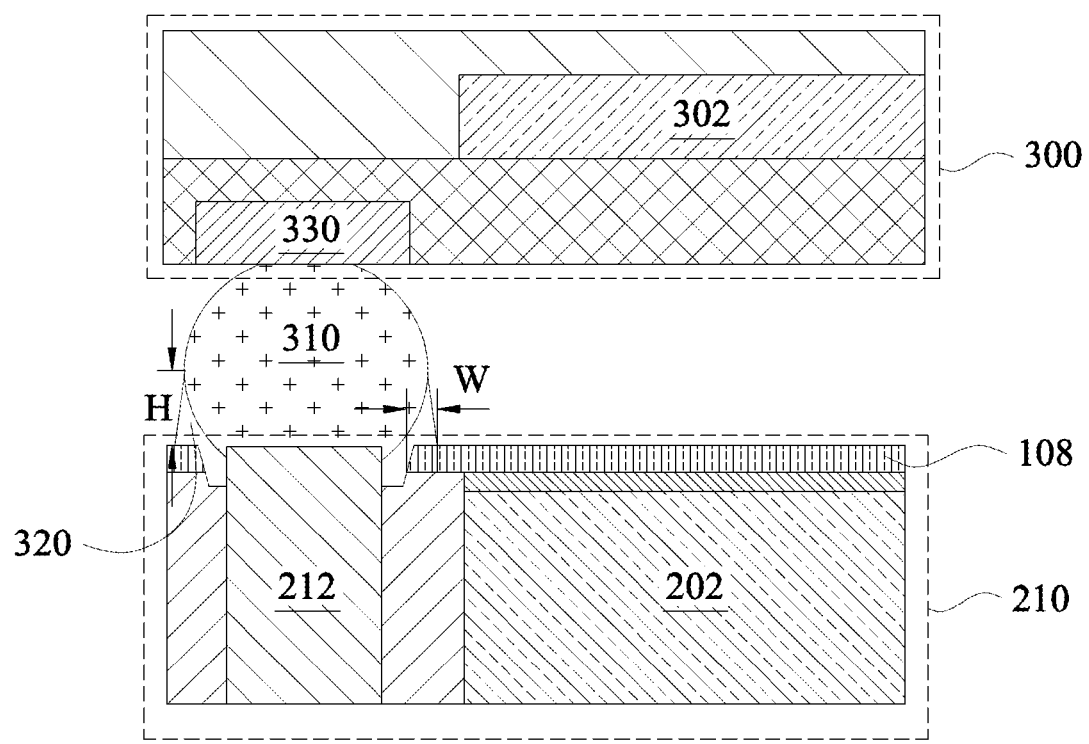
FIG. 10 illustrates a cross sectional view of another joint structure of the package-on-package semiconductor device shown in FIG. 1 in accordance with various embodiments of the present disclosure.

FIG. 10 illustrates a cross sectional view of another joint structure of the package-on-package semiconductor device shown in FIG. 1 in accordance with various embodiments of the present disclosure. The joint structure shown in FIG. 10 is similar to the joint structure shown in FIG. 9 except that the upper terminal of through via 212 is embedded in the solder ball 310.

Before the solder ball 310 is connected to the through via 212, a trench may be formed around the through via 212. The bottom of the trench is lower than the top surface of the through via 212. The depth of the trench is in a range from about 10 um to about 40 um. In addition, the width of the bottom of the trench is greater than the width of the top surface of the through via 212. After a reflow process is performed to melt the solder ball 310, the upper terminal of the through via 212 is surrounded by the solder ball 310.

The protection layer 320 includes two portions. A first portion surrounds the lower portion of the solder ball 310. A second portion fills the gap between the outer surface of the solder ball 310 and the sidewalls of the trench in the dielectric layer 108. As shown in FIG. 10, the bottom of the second portion of the protection layer 320 is lower than the top surface of the through via 212.

In some embodiments, the width of the protection layer 320 is defined as W as shown in FIG. 10. The height of the protection layer 320 is defined as H as shown in FIG. 9. In some embodiments, W is in a range from about 5 um to about 30 um. H is in a range from about 5 um to about 50 um.

In accordance with an embodiment, a device comprises a bottom package comprising a plurality of front-side interconnect structures, a plurality of first bumps on a first side of the front-side interconnect structures, a plurality of backside interconnect structures comprising a dielectric layer and a plurality of metal structures embedded in the dielectric layer and a first semiconductor die on a second side of the front-side interconnect structures, wherein the first semiconductor die is between the front-side interconnect structures and the backside interconnect structures.

The device further comprises a top package bonded on the backside interconnect structures, wherein the top package comprises a second bump, and wherein the second bump and a corresponding metal structure form a joint structure between the top package and the bottom package and a protection layer having a first edge in direct contact with a top surface of the dielectric layer and a second edge surrounding a lower portion of the second bump.

In accordance with an embodiment, a device comprises a top package mounted on a bottom package through a joint structure, wherein the joint structure comprises a solder ball of the top package coupled to a metal structure embedded in the bottom package and an epoxy protection layer having a first edge in direct contact with a top surface of the bottom package and a second edge surrounding a lower portion of the solder ball.

In accordance with an embodiment, a method comprises forming a trench over a top surface of a metal structure of a bottom package, dispersing an epoxy flux material in the trench, mounting a top package on the bottom package, wherein a solder ball of the top package is in direct contact with the top surface of the metal structure and performing a reflow process to form a joint structure, wherein the joint structure comprises the solder ball of the top package coupled to the metal structure in the bottom package and an epoxy protection layer having a first edge in direct contact with a top surface of the bottom package and a second edge surrounding a lower portion of the solder ball.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a bottom package comprising:
  a plurality of front-side interconnect structures;
  a plurality of first bumps on a first side of the front-side interconnect structures;
  a plurality of backside interconnect structures comprising a dielectric layer and a plurality of metal structures embedded in the dielectric layer; and
  a first semiconductor die on a second side of the front-side interconnect structures, wherein the first semiconductor die is between the front-side interconnect structures and the backside interconnect structures; and
 a top package bonded on the backside interconnect structures, wherein:
  the top package comprises a second bump, and wherein the second bump and a corresponding metal structure form a joint structure between the top package and the bottom package; and
  a protection layer having a first edge in direct contact with a top surface of the dielectric layer and a second edge surrounding a lower portion of the second bump.

2. The device of claim 1, wherein:
 the protection layer comprises epoxy.

3. The device of claim 1, further comprising:
 a second semiconductor die on the second side of the front-side interconnect structures, wherein the second semiconductor die is between the front-side interconnect structures and the backside interconnect structures.

4. The device of claim 1, wherein:
 the first semiconductor die is a logic integrated circuit.

5. The device of claim 1, wherein:
 the first semiconductor die is embedded in a molding compound layer, wherein the molding compound layer is between the front-side interconnect structures and the backside interconnect structures.

6. The device of claim 5, further comprising:
 a plurality of through vias in the molding compound layer, wherein the through vias are electrically coupled between the front-side interconnect structures and the backside interconnect structures.

7. The device of claim 1, wherein the protection layer comprises:
 a first portion surrounding the lower portion of the second bump; and
 a second portion in a gap between the dielectric layer and the second bump.

8. A device comprising:
 a top package mounted on a bottom package through a joint structure, wherein the joint structure comprises:
  a solder ball of the top package coupled to a metal structure embedded in the bottom package; and
  an epoxy protection layer having a first edge in direct contact with a top surface of the bottom package and a second edge surrounding a lower portion of the solder ball, wherein the epoxy protection layer extends from a sidewall of a dielectric layer of the bottom package to a surface of the lower portion of the solder ball.

9. The device of claim 8, wherein the bottom package comprises:
 a plurality of front-side interconnect structures;
 a plurality of first bumps on a first side of the front-side interconnect structures; and
 a plurality of backside interconnect structures comprising a dielectric layer and a plurality of redistribution lines embedded in the dielectric layer.

10. The device of claim 9, further comprising:
 a first semiconductor die bonded on a second side of the front-side interconnect structures, wherein the first semiconductor die is between the front-side interconnect structures and the backside interconnect structures.

11. The device of claim 10, wherein:
the first semiconductor die is encapsulated by a molding compound layer.

12. The device of claim 8, wherein:
the epoxy protection layer is of a concave meniscus shape.

13. The device of claim 8, wherein:
the metal structure is a redistribution line.

14. The device of claim 8, wherein:
the metal structure is a through via.

15. A device comprising:
a bottom package comprising a metal structure, wherein a top surface of the metal structure is lower than a top surface of the bottom package; and
a top package mounted on the bottom package through a joint structure, wherein the joint structure comprises:
  a solder ball of the top package on the metal structure, wherein at least a portion of the solder ball is in a dielectric layer of the bottom package; and
  a protection layer, wherein:
    a lower portion of the solder ball is surrounded by the protection layer; and
    the solder ball and the dielectric layer are separated by the protection layer.

16. The device of claim 15, wherein:
the protection layer is formed of epoxy.

17. The device of claim 16, wherein the protection layer comprises:
a first portion over the top surface of the bottom package and surrounding the lower portion of the solder ball; and
a second portion in a gap between the dielectric layer and the solder ball.

18. The device of claim 15, wherein the bottom package comprises:
a plurality of front-side interconnect structures;
a plurality of first bumps on a first side of the front-side interconnect structures; and
a plurality of backside interconnect structures comprising a plurality of redistribution lines and the dielectric layer.

19. The device of claim 15, wherein:
the metal structure is a through via.

20. The device of claim 19, wherein:
a bottom surface of the protection layer is in direct contact with a top surface of the through via.

* * * * *